(12) United States Patent
Shim

(10) Patent No.: US 7,054,221 B2
(45) Date of Patent: May 30, 2006

(54) DATA PASS CONTROL DEVICE FOR MASKING WRITE RINGING IN DDR SDRAM AND METHOD THEREOF

(75) Inventor: Young Bo Shim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/871,798

(22) Filed: Jun. 18, 2004

(65) Prior Publication Data

US 2004/0264291 A1 Dec. 30, 2004

(30) Foreign Application Priority Data

Jun. 30, 2003 (KR) ...................... 10-2003-0043906

(51) Int. Cl.
*G11C 8/00* (2006.01)
(52) U.S. Cl. ...................................... 365/233; 365/193
(58) Field of Classification Search .................. 365/233
See application file for complete search history.

(56) References Cited

U.S. PATENT DOCUMENTS

| | | | |
|---|---|---|---|
| 5,165,087 A | 11/1992 | Schwee | |
| 6,034,916 A | 3/2000 | Lee | |
| 6,064,625 A | 5/2000 | Tomita | |
| 6,282,132 B1 | 8/2001 | Brown et al. | |
| 6,292,410 B1 | 9/2001 | Yi et al. | |
| 6,301,189 B1* | 10/2001 | Bae .............................. 365/233 |
| 6,324,119 B1* | 11/2001 | Kim ............................ 365/233 |
| 6,445,642 B1 | 9/2002 | Murakami | |
| 6,459,651 B1 | 10/2002 | Lee et al. | |
| 6,477,710 B1 | 11/2002 | Ojoyeyi | |
| 6,498,766 B1 | 12/2002 | Lee et al. | |
| 6,519,188 B1* | 2/2003 | Ryoo et al. ............. 365/189.05 |
| 6,707,723 B1* | 3/2004 | Jeong .................... 365/189.05 |
| 6,728,162 B1* | 4/2004 | Lee et al. .................... 365/233 |
| 2001/0004335 A1 | 6/2001 | Murakami | |
| 2001/0043505 A1 | 11/2001 | Lee et al. | |
| 2003/0021164 A1 | 1/2003 | Yoo et al. | |

FOREIGN PATENT DOCUMENTS

| | | |
|---|---|---|
| JP | 07-141286 | 6/1995 |
| JP | 10-207771 | 8/1998 |
| JP | 11-288590 | 10/1999 |
| JP | 2000-043398 | 2/2000 |
| JP | 2000-156082 | 6/2000 |
| JP | 2001-236782 | 8/2001 |
| JP | 2002-222591 | 8/2002 |

* cited by examiner

*Primary Examiner*—Thong Q. Le
(74) *Attorney, Agent, or Firm*—Ladas & Parry LLP

(57) ABSTRACT

The present invention relates to a data pass control device for masking a ringing of a data strobe that occurs when a write operation in a DDR SDRAM is completed. The data pass control device for masking the write ringing in the DDR SDRAM can be advantageously used for masking only a section with the ringing problem during the write operation, so that any unnecessary operations during the write operation can be eliminated and a more stable write operation can be realized by eliminating a write fail.

6 Claims, 4 Drawing Sheets

DATA PASS CONTROL DEVICE FOR MASKING WRITE RINGING IN DDR SDRAM AND METHOD THEREOF

BACKGROUND OF THE INVENTION

1. Field of the Invention

The present invention relates to a data pass control device for masking a write ringing in a DDR SDRAM (Double Data Rate Synchronous Dynamic Random Access Memory) and a method thereof and more particularly, to a data pass control device for masking a write ringing that occurs at the completion of the writing operation of the DDR SDRAM and a method thereof.

2. Description of the Related Art

A DDR SDRAM is generally a memory device that generates an internal synchronization clock clk generated from an external synchronization clock ext_clk through a DLL circuit or other circuit and then inputs/outputs data synchronously with the rising and falling edges of the internal synchronization clock clk. The internal synchronization clock clk is also referred as to a master clock master clk.

What is going to be described here in connection with the DDR SDRAM is one particular operation, that is, how to eliminate failure or malfunction of a memory device, caused by ringing during a write operation.

Typically, the ringing during the write operation is referred as to a write ring back phenomenon. When this write ring back occurs, an unwanted dummy write operation is performed due to the ringing of a data strobe signal at the last phase of the write operation and then existing data stored in a data latch is changed, resulting in a write error. The data strobe signal and data latch will be described later in detail.

Hereinafter, it will be appropriate to give definitions of signals used in this specification and then problems found in related art techniques will be described next.

<Definitions of Signals>

1. ext_clk: An external synchronization clock that is applied from the outside of the DDR SDRAM.

2. clk: An internal synchronization clock generated by receiving the external synchronization clock. This is an internal master clock, synchronizing data input/output. In other words, this is the master clock for controlling overall operations of the DDR SDRAM.

3. din: Data inputted from the outside during a write operation of the DDR SDRAM. This is the abbreviation of input data. Usually, a voltage level of the input data din is SSTL level. This input data din is applied to a data input buffer din_buffer.

4. ds: Data strobe signal inputted from the outside during a write operation of the DDR SDRAM. The ds signal, which will be described later, transfers the input data din onto global input/output lines gio. In general, voltage level of the ds signal is SSTL level. The ds signal is applied to a data strobe buffer ds_buffer.

5. din_buffer: A data input buffer. This amplifies the SSTL level of the input data din inputted from the outside during a write operation of the DDR SDRAM up to CMOS level. If the voltage level of the input data din is higher than a designated reference voltage level, a high level is outputted to output line in and a low level is outputted to output line inz. On the contrary, if voltage level of the input data din is lower than the designated reference voltage level, the high level is outputted to the output line inz and the low level is outputted to the output line in. Here, the output line inz denotes input bar (i.e./din). According to en_dinz signal (enable data input bar signal), the data input buffer din_buffer is disabled during a read operation but enabled during a write operation.

6. ds_buffer: A data strobe buffer. This amplifies the SSTL level of the data strobe signal ds inputted from the outside during a write operation of the DDR SDRAM up to CMOS level. If voltage level of the inputted data strobe signal ds is higher than a designated reference voltage (that is, a high level), an output signal rdinclk is outputted as a high level signal and a output signal fdinclk is outputted as a low level signal. On the other hand, if the voltage level of the data strobe signal ds is lower than the designated reference voltage (that is, a lower level), the rdinclk is outputted as a low level signal and the fdinclk is outputted as a high level signal. Here, the rdinclk is the abbreviation of a rising data input clock, and the fdinclk is the abbreviation of a falling data input clock. According to the en_dinz signal (enable data input bar signal), the data strobe buffer ds_buffer is disabled during a read operation but enabled during a write operation.

7. din_lat: A data latch means. In a case that an input signal ds of the data strobe buffer ds_buffer is on a rising edge, data outputted from the data input buffer din_buffer is synchronized with an output signal rdinclk of the data strobe buffer and then stored in the data latch means. In addition, in a case that an input signal ds of the data strobe buffer ds_buffer is on a falling edge, data outputted from the data input buffer din_buffer is synchronized with an output signal fdinclk of the data strobe buffer and then stored in the data latch means. The data din stored in the data latch means din_lat is transferred to the global input/output lines gio, in response to a control signal dinstb (data input strobe).

8. dis_diz: Based on an assumption that a data strobe signal ds is on a falling edge, an output signal of a controller outputting a disable level output signal dis_diz (disable data strobe bar) after receiving the fdinclk signal which is an output signal of the data strobe buffer ds_buffer. The disable level output signal dis_dsz is feedbacked to the data strobe buffer ds_buffer and as a result, the fdinclk signal pass is blocked (or masked). Afterwards, the disable level output signal dis_dsz becomes an enable level signal by the internal synchronization clock clk and thus, enables the data strobe buffer to pass the next fdinclk signal.

9. en_dinz: A signal that enables the data input buffer. din_buffer and the data strobe buffer ds_buffer during a write operation and disables the data input buffer din_buffer and the data strobe buffer ds_buffer during a read operation.

10. en_din: A signal having a voltage level opposite to the voltage level of en_dinz.

11. dinstb: A signal for synchronizing a data stored in the data latch means din_lat with the internal synchronization clock clk and transmitting to the global input/output lines gio.

Hereinafter it will be explained of related art techniques.

FIG. 1 is a schematic block diagram illustrating a data pass controller used in a write operation of a related art DDR SDRAM.

As shown in FIG. 1, the related art data pass controller includes an input buffer 100, a data strobe buffer 110, a data latch 120, and a data strobe buffer controller 130. Here, the data input buffer 100 is denoted by din_buffer; the data strobe buffer 110 is denoted by ds_buffer; and the data latch 120 is denoted by din_lat.

Since functions of each individual elements and their signals are already described above, the overall operation of the data pass controller will now be briefly described below and then a write ringing at the last phase of the write operation will be detailed next. Further referring to FIG. 1, FIG. 2 illustrates a waveform diagram of signals in FIG. 1.

First, the overall operation of the data pass controller depicted in FIG. 1 is as follows:

1) During a write operation, the data input buffer 100 and the data strobe buffer 110 are enabled according to en_dinz signal.

2) Data din inputted from the external is transferred to output lines in, inz through the data input buffer 100.

3) Data strobe signal ds applied in pulse type outputs pulse type of signals rdinclk, fdinclk through the data strobe buffer 110.

4) When the data strobe signal ds is on a rising edge, the data on the output lines in, inz of the data input buffer 100 is synchronized with the rdinclk signal and is stored in the data latch 120. On the other hand, when the data strobe signal ds is on a falling edge, the data on the output lines in, inz of the data input buffer 100 is synchronized with the fdinclk signal and is stored in the data latch 120.

5) The stored data in the data latch 120 is transferred to global input/output lines gio, in response to a data input strobe signal dinstb.

6) The output signal fdinclk at the step 3) is also applied to the data strobe buffer controller 130. In case that the data strobe signal ds is on the falling edge, the data strobe buffer controller 130 is synchronized with the fdinclk signal among the output signals of the data strobe buffer ds_buffer and outputs a disable level output signal dis_dsz (disable data strobe bar). This disable level output signal dis_dsz is feedbacked to the data strobe buffer ds_buffer and as a result, the fdinclk signal pass is blocked (or masked). By the internal synchronization clock clk, the disable level output signal dis_dsz becomes an enable level signal and enables the data strobe buffer 110 to pass next fdinclk signal (reference to FIG. 2).

With reference to FIGS. 1 and 2, the following will now describe the write ringing that occurs during the write operation.

As illustrated in FIG. 2, when the en_dinz signal is enabled to a low level, the data input buffer 100 and the data strobe buffer 110 are enabled. Therefore, the input data din is transferred to the output lines in, inz of the data input buffer 100. Still referring to FIG. 2, the data strobe signal ds is applied as a pulse type of signal. Moreover, assuming that the ringing does not occur, a data strobe signal made of four pulse signals has four rising edges and four falling edges, so that a total of 8 data will be stored in the data latch 120. For example, DQ1, DQ2, DQ3, DQ4, DQ5, DQ6, DQ7, and DQ8 data will be inputted in sequence through an input line of the data input buffer 100.

More details are as follows:

1) In response to the rising edge of a first data strobe signal ds, the first data DQ1 is stored in the data latch 120.

2) In response to the falling edge of the first data strobe signal ds, the second data DQ2 is stored in the data latch 120. Here, a high pulse signal fdinclk is outputted in response to the falling edge of the first data strobe signal ds. Then the controller 130 receives the signal fdinclk and outputs a low level enable signal dis_dsz. The low level enable signal dis_diz is feedbacked to the data strobe buffer 110, to block (or mask) the generation of the fdinclk signal. As described above, the second data DQ2 is stored in the data latch 120 in response to the fdinclk signal generated before it is masked by the low level enable signal dis_dsz. Hence, the first data DQ1 and the second data DQ2 stored in the data latch 120 are transferred to the global input/output lines gio by the data input strobe signal dinstb. Accordingly, the first write operation is completed. The next step is, as shown in FIG. 2, that the output signal dis_dsz of the controller transits to a high level by the internal clock clk and enables the data strobe buffer ds_buffer. As a result of this, the data strobe buffer ds_buffer starts operating normally.

3) The operations of a second, a third, and a fourth data strobe signal ds on the rising and falling edges are identical with the ones described in steps 1) and 2).

4) However, in the case of the related art, as illustrated in FIG. 2, after the falling edge of the fourth data strobe signal ds, for some reason the ringing occurs when the data strobe signal ds turns back to the termination voltage or standby voltage. What happens in such case is that the signals rdinclk and fdinclk are generated at the rising and falling edges of the data strobe signal generated due to the ringing and as a result, an invalid data is applied to the data latch 120.

SUMMARY OF THE INVENTION

Accordingly, the present invention has been made in an effort to solve the problems occurring in the related art, and an object of the present invention is to provide a data pass control device for masking ringing of a data strobe signal ds during a write operation.

Another object of the present invention is to provide a device for disabling a data strobe buffer when a write operation section is completed, thereby masking the ringing of the data strobe signal.

In order to achieve the above object, according to one aspect of the present invention, there is provided a data pass control device for masking a write ringing in a DDR SDRAM, including: a data input buffer for receiving data inputted from the outside; a data strobe buffer for receiving a data strobe signal inputted from the outside and outputting first and second control signal; a data latch for storing the data outputted from the data input buffer, in response to the first and second control signals; a data strobe buffer controller for outputting a third control signal to control an operation of the data strobe buffer; and a write operation period detector for detecting a write operation section during a write operation and thereby outputting a fourth control signal to control the data strobe buffer controller, wherein the third control signal enables the data strobe buffer in the write operation period and disables the data strobe buffer when the write operation is completed.

Desirably, the fourth control signal is enabled when a write command is inputted and is disabled when the write operation is completed, and in case the fourth control signal is disabled, the third control signal disables the data strobe buffer.

According to another aspect of the invention, a data pass control device for masking the write ringing in the DDR SDRAM includes: a data input buffer for receiving data inputted from the outside; a data strobe buffer for receiving a data strobe signal inputted from the outside and outputting first and second control signal; a data latch for storing the data outputted from the data input buffer, in response to the first and second control signals; a data strobe buffer controller for outputting a third control signal to control an operation of the data strobe buffer; and a write operation period detector for detecting a write operation period during a write operation and thereby outputting a fourth control signal to control the data strobe buffer controller, wherein after data strobe signals are all inputted normally the third control signal disables the data strobe buffer to mask the ringing from the outside.

Desirably, the fourth control signal is enabled when a write command is inputted and is disabled when the write operation period is completed, and in case the fourth control signal is disabled, the third control signal disables the data strobe buffer.

Still another aspect of the invention provides a data pass control method for masking the write ringing in a DDR SDRAM, the method including the steps of: receiving data inputted from the outside through a data input buffer; receiving a data strobe signal inputted from the outside through a data strobe buffer and outputting first and second control signals; storing the data outputted from the data input buffer to a data latch in response to the first and second control signals; outputting a third control signal to control operations of the data strobe buffer through a controller; and detecting a write operation period during a write operation and outputting a fourth signal to control the data strobe buffer controller, wherein the third control signal masks the write ringing in the DDR SDRAM which enables the data strobe buffer during the write operation period and disables the data strobe buffer when the write operation period is completed.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
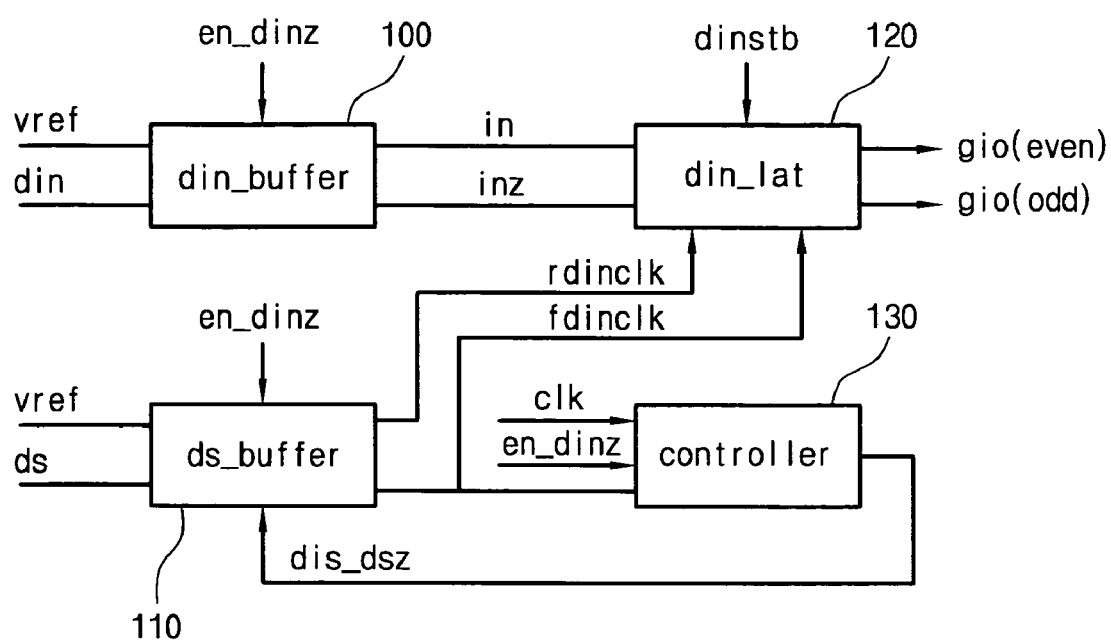
FIG. 1 is a schematic block diagram illustrating a data pass controller used in a write operation of a related art DDR SDRAM.
Figure 2:
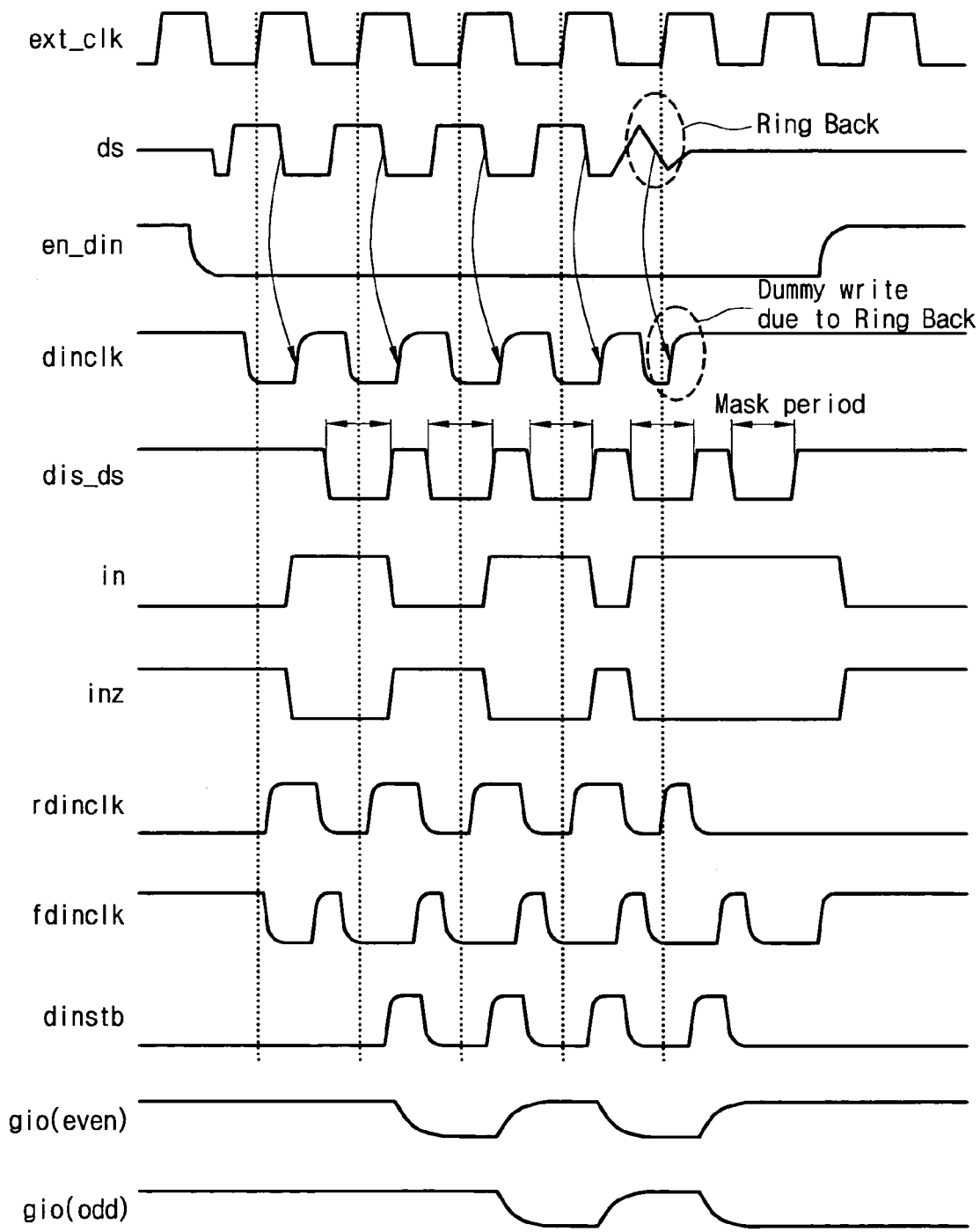
FIG. 2 illustrates a waveform diagram of signals used in FIG. 1.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
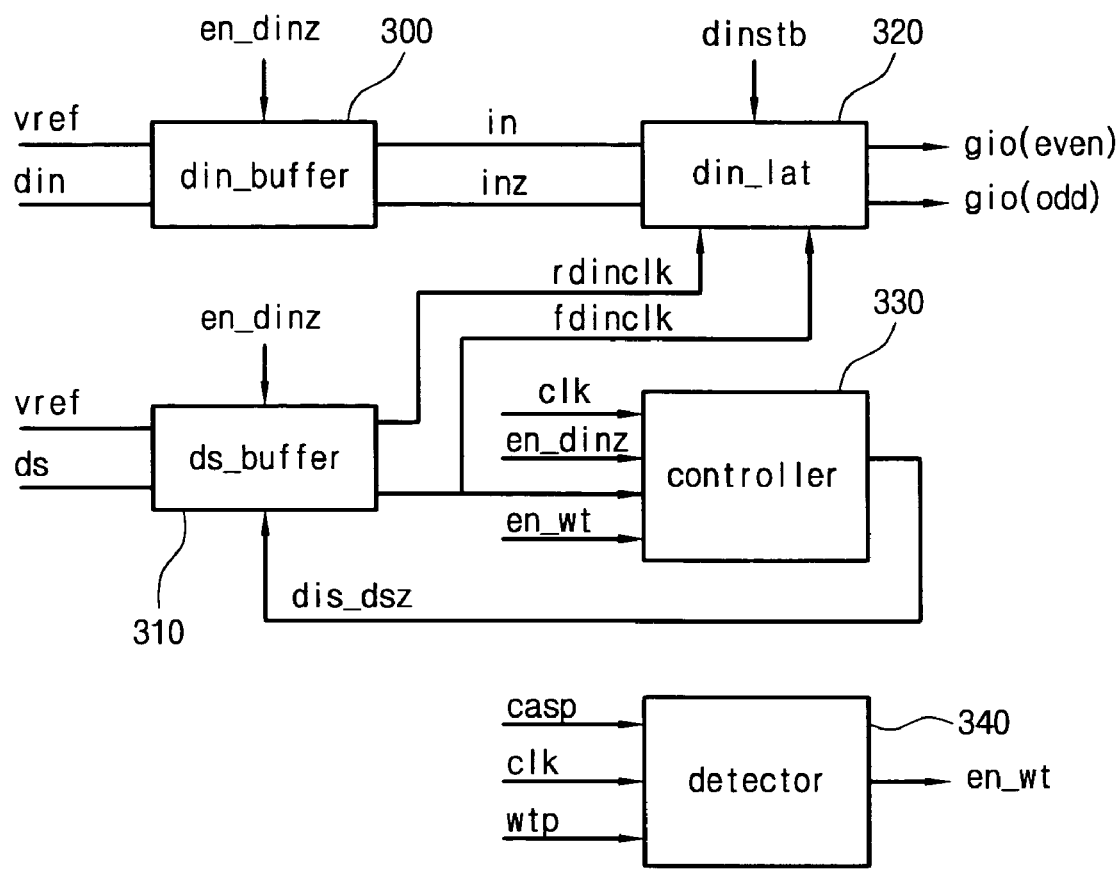
FIG. 3 is a block diagram illustrating a data pass controller for masking a write ringing in a DDR SDRAM according to the present invention.

FIG. 3 is a block diagram illustrating a data pass controller for masking a write ringing in a DDR SDRAM according to the present invention.

As shown in FIG. 3, the data pass controller for masking the write ringing in the DDR SDRAM includes a data input buffer 300 for receiving data inputted from the outside; a data strobe buffer 310 for receiving a data strobe signal inputted from the outside and outputting first and second control signal rdinclk, fdinclk; a data latch 320 for storing the data outputted from the data input buffer 300 in response to the first and second control signals; a data strobe buffer controller 330 for outputting a third control signal dis_dsz to control the operation of the data strobe buffer 310; and a write operation period detector 340 for sensing a write operation section during the write operation and outputting a fourth control signal en_wt for controlling the controller 330.

Figure 4:
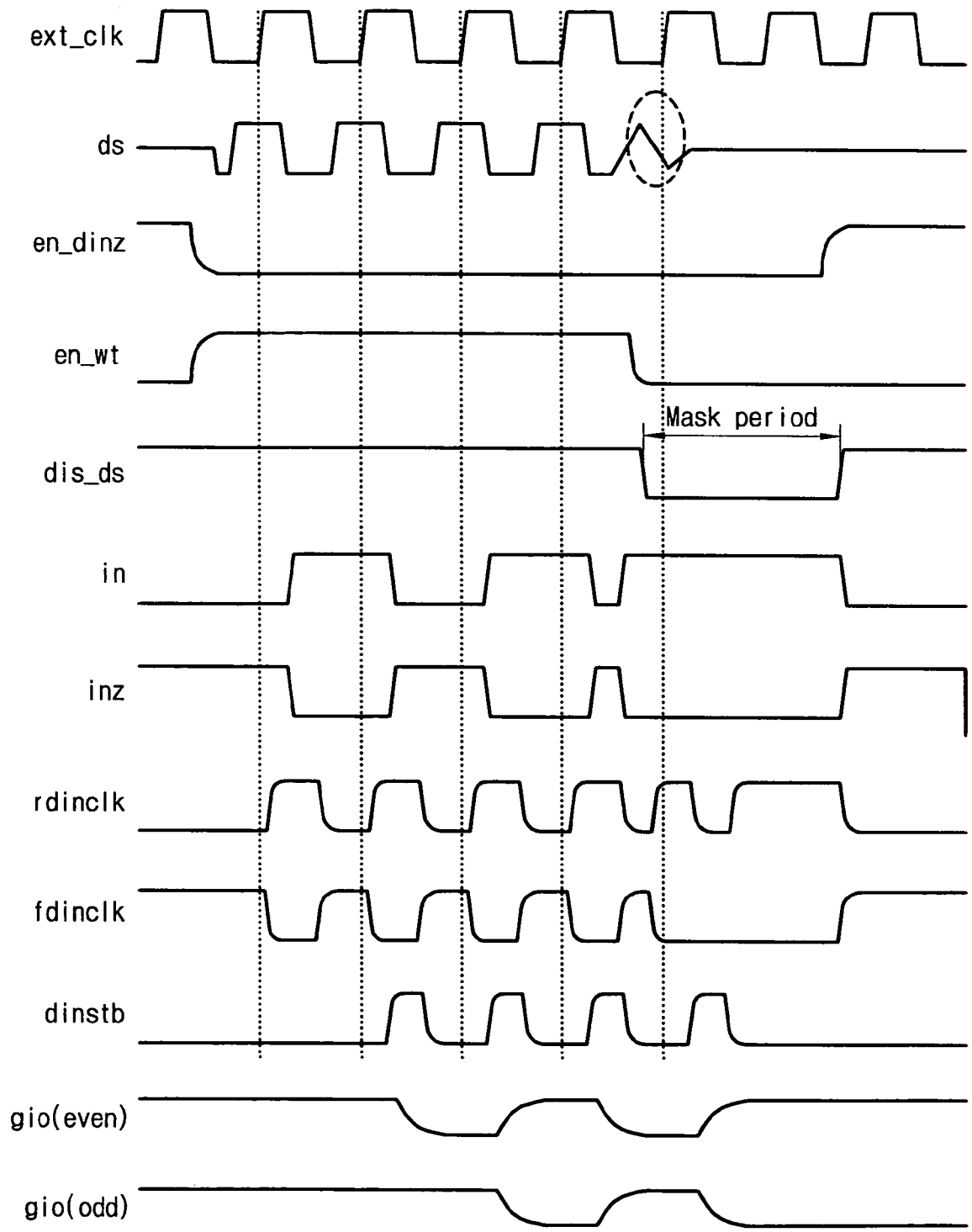
FIG. 4 illustrates a waveform diagram of signals used in FIG. 3.

The write operation period detector 340 of FIG. 3 is synchronized with an internal CLK. Also, the write operation period detector 340 receives a pulse signal wtp generated for a write command and a CAS signal casp used during the write operation, and outputs the signal en_wt for controlling the controller 330. The waveform of this output signal en_wt is illustrated in FIG. 4. The output signal en_wt is characterized of transition from the last falling edge of the ds signal to a lower level and what this means will be described later.

Hereinafter, the overall operation of the data pass controller will be briefly described and then the write ringing at the last phase of the write operation will be detailed next. For reference, FIG. 4 is a waveform diagram of signals used in a block diagram illustrated in FIG. 3.

First, the overall operation of the data pass controller shown in FIG. 3 is as follows:

1) During the write operation, the data input buffer 300, the data strobe buffer 310, and the write operation period detector 340 are enabled responsive to en_dinz signal.

2) Data din outputted from the outside is transferred to output lines in, inz through the data input buffer 300.

3) Data strobe signal ds applied in pulse type outputs pulse type of signals rdinclk, fdinclk through the data strobe buffer 310.

4) When the data strobe signal ds is on a rising edge, a transferred data to the output lines in, inz of the data input buffer 300 is synchronized with the rdinclk signal and is stored in the data latch 320. On the other hand, when the data strobe signal ds is on a falling edge, a transferred data to the output lines in, inz of the data input buffer 300 is synchronized with the fdinclk signal and is stored in the data latch 320.

5) The stored data in the data latch 320 is transferred to global input/output lines gio, in response to a data input strobe signal dinstb.

6) The output signal fdinclk at step 3) is also applied to the data strobe buffer controller 330 (as described above, the data strobe buffer controller 330 is enabled by the en_dinz signal). In addition, the control signal en_wt generated from the write operation period detector 340 controls that the strobe buffer is in an enable state when the write command is inputted, and disables the data strobe buffer 330 when the write operation section ends. In case that the control signal en_wt is disabled, the control signal dis_dsz outputted from the data strobe buffer controller 330 disables the data strobe buffer (reference to FIG. 4). When the data strobe buffer ds_buffer is disabled, the part where the ringing occurs to the ds signal (this corresponds to the 'a' part of the ds signal in FIG. 4) is masked by the control signal dis_dsz (as shown in the mask period 'b' of the dis_dsz signal in FIG. 4). Accordingly, only a valid data can be transferred to the global input/output lines.

Hereinafter, DQ1, DQ2, DQ3, DQ4, DQ5, DQ6, DQ7, and DQ8 data are inputted in sequence through the input line of the data input buffer 300.

More details are as follows:

1) In response to the rising edge on a first data strobe signal ds, the first data DQ1 is stored in the data latch 320.

2) In response to the falling edge of the first data strobe signal ds, the second data DQ2 is stored in the data latch 320. The first and second data DQ1, DQ2 stored in the data latch 320 are then transferred to the global input/output lines gio by the dinstb signal. Accordingly, the first write operation is completed.

3) For a predetermined time after the write operation starts, the data strobe buffer controller 330 outputs a signal to enable the data strobe buffer 310. Therefore, as shown in FIG. 4, the output signal dis_dsz of the data strobe buffer controller 330 maintains its high level in a normal write operation period. In consequence, the data strobe buffer 310 having received the data strobe signal ds outputs output signals rdinclk, fdinclk normally.

4) The operations of a second, a third, and a fourth data strobe signal ds on the rising and falling edges are identical with the ones described in steps 1), 2) and 3). In the meantime, the write operation period detector 340 outputs a high level enable signal en_wt only for the section where the data strobe signal ds is applied normally and applies the enable signal to the data strobe buffer controller 330.

5) After the fourth data strobe signal ds is applied, the output signal en_wt of the write operation period detector 340 transits to a low level, thereby causing the output signal dis_dsz of the data strobe buffer controller 330 to transit to a low level. As a result, the data strobe buffer 310 is disabled. Therefore, although the ringing may occur on the data strobe signal ds, the data stored in the data latch 320 can be safely transferred to the global input/output lines gio.

As apparent from the above description, the present invention provides a means for controlling a normal operation period of the data strobe signal and further, blocking (or masking) the ringing that occurs after the operational period of the data strobe signal.

While other modifications for circuit structure can be suggested without departing the spirit and scope of the invention, it is to be understood by persons skilled in the art that relative inventions or teachings for masking the ringing through a control over the normal operation period of the data strobe buffer are within the scope of the present invention.

In conclusion, the data pass control device for masking the write ringing in the DDR SDRAM can be advantageously used for masking only a period with the ringing problem during the write operation, so that any unnecessary operations during the write operation can be eliminated and a more stable write operation can be realized by eliminating the write error.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A data pass control device for masking a write ringing in a write operation after generating a predetermined length of data strobe signal in a DDR SDRAM, the data pass control device comprising:
    a data input buffer for receiving data inputted from the outside of the device;
    a data strobe buffer for receiving a predetermined length of data strobe signal inputted from the outside of the device and outputting first and second control signals;
    a data latch for storing the data outputted from the data input buffer, in response to the first and second control signals;
    a data strobe buffer controller for outputting a third control signal to control an operation of the data strobe buffer; and
    a write operation period detector for detecting a write operation period during a write operation and outputting a fourth control signal to control the data strobe buffer controller,
    wherein the fourth control signal is outputted when the predetermined length of data strobe signal is present, and
    wherein the third control signal enables the data strobe buffer in the write operation period and disables the data strobe buffer when the write operation is completed in response to the fourth signal.

2. The data pass control device according to claim 1, wherein the fourth control signal is enabled when a write command is inputted and is disabled when the write operation period is completed, and
    in case the fourth control signal is disabled, the third control signal disables the data strobe buffer.

3. A data pass control device for masking write ringing in a write operation after generating a predetermined length of data strobe signal in a DDR SDRAM, the data pass control device comprising:
    a data input buffer for receiving data inputted from the outside;
    a data strobe buffer for receiving a predetermined length of data strobe signal inputted from the outside and outputting first and second control signals;
    a data latch for storing the data outputted from the data input buffer, in response to the first and second control signals;
    a data strobe buffer controller for outputting a third control signal to control an operation of the data strobe buffer; and
    a write operation period detector for detecting a write operation period during a write operation and outputting a fourth control signal to control the data strobe buffer controller,
    wherein the fourth control signal is outputted when the predetermined length of data strobe signal is present, and
    wherein the third control signal enables the data strobe buffer in the write operation period and disables the data strobe buffer when the write operation is completed in response to the fourth signal.

4. The data pass control device according to claim 3, wherein the fourth control signal is enabled when a write command is inputted and is disabled when the write operation period is completed, and in case that the fourth control signal is disabled, the third control signal disables the data strobe buffer.

5. A data pass control method for masking write ringing in a write operation after generating a predetermined length of data strobe signal in a DDR SDRAM, the data pass control device comprising:
    receiving data inputted from the outside through a data input buffer;
    receiving predetermined length of a data strobe signal inputted from the outside through a data strobe buffer and outputting a first control signal and a second control signal;
    storing the data outputted from the data input buffer in a data latch, in response to the first and second control signals;
    outputting a third control signal to control the data strobe buffer through a controller; and detecting a write operation period during a write operation and outputting a fourth signal to control the data strobe buffer controller, wherein the fourth control signal is outputted when the predetermined length of data strobe signal is present, and wherein the third control signal enables the data strobe buffer in the write operation period and disables the data strobe buffer when the write operation is completed in response to the fourth signal.

6. The data pass control method according to claim 5, wherein the fourth control signal is enabled when a write command is inputted and is disabled when the write operation period is completed, and in case the fourth control signal is disabled, the third control signal disables the data strobe buffer.

* * * * *